United States Patent
Kliegelhöfer et al.

(10) Patent No.: US 6,907,544 B2
(45) Date of Patent: Jun. 14, 2005

(54) METHOD FOR OPERATING MEMORY DEVICES FOR STORING DATA

(75) Inventors: Peter Kliegelhöfer, München (DE); Gerhard Pöppel, Regensburg (DE); Björn Steurich, München (DE); Rudolf Ullmann, Ottobrunn (DE); Michael Verbeck, München (DE)

(73) Assignee: Infineon Technologies AG, Munich (DE)

( * ) Notice: Subject to any disclaimer, the term of this patent is extended or adjusted under 35 U.S.C. 154(b) by 484 days.

(21) Appl. No.: 09/845,874

(22) Filed: Apr. 30, 2001

(65) Prior Publication Data

US 2002/0010876 A1 Jan. 24, 2002

Related U.S. Application Data

(63) Continuation of application No. PCT/EP99/02761, filed on Apr. 19, 1999.
(60) Provisional application No. 60/106,370, filed on Oct. 30, 1998.

(51) Int. Cl.$^7$ ............................................. G06F 11/00
(52) U.S. Cl. ........................................ 714/6; 714/780
(58) Field of Search ......................... 714/6, 780, 819, 714/822, 797

(56) References Cited

U.S. PATENT DOCUMENTS

| | | | |
|---|---|---|---|
| 2,910,584 A | * 10/1959 | Steele | 326/35 |
| 3,863,215 A | * 1/1975 | McGrogan, Jr. | 714/822 |
| 4,183,463 A | 1/1980 | Kemmetmueller | |
| 4,296,494 A | * 10/1981 | Ishikawa et al. | 714/6 |
| 4,519,079 A | * 5/1985 | Hamer | 714/702 |
| 4,748,594 A | * 5/1988 | Iida | 365/200 |
| 5,031,180 A | * 7/1991 | McIver et al. | 714/797 |
| 5,067,111 A | * 11/1991 | Asano et al. | 365/189.08 |
| 5,128,944 A | * 7/1992 | Flaherty et al. | 714/6 |
| 5,386,533 A | * 1/1995 | Morris | 711/103 |
| 5,475,693 A | 12/1995 | Christopherson et al. | |
| 5,968,198 A | * 10/1999 | Hassan et al. | 714/752 |
| 6,195,777 B1 | * 2/2001 | Luby et al. | 714/752 |
| 6,470,472 B1 | * 10/2002 | Johansson | 714/785 |
| 6,519,740 B1 | * 2/2003 | Mårtensson et al. | 714/822 |
| 6,637,005 B1 | * 10/2003 | Kohnen | 714/797 |

FOREIGN PATENT DOCUMENTS

| | | |
|---|---|---|
| DE | 31 34 995 A1 | 3/1983 |
| EP | 0 615 211 A1 | 9/1994 |
| EP | 0 753 815 A2 | 1/1997 |
| JP | 58 053 090 | 3/1983 |
| JP | 58 105 498 | 6/1983 |

OTHER PUBLICATIONS

Ph. Charpentier et al.: "Contrôle d'intégrité du contenu d'une mémoire programme: etude comparative du CRC et du Checksum", *L'Onde Electrique*, Mar./Apr. 1991, vol. 71, No. 2, pp. 52–57.

* cited by examiner

*Primary Examiner*—Robert Beausoliel
*Assistant Examiner*—Gabriel L. Chu
(74) *Attorney, Agent, or Firm*—Laurence A. Greenberg; Werner H. Stemer; Ralph E. Locher

(57) ABSTRACT

A storage device is disclosed and is characterized in that the data to be stored therein can be automatically and repeatedly stored in the device and/or in that additional information dependent on the data to be stored therein can be generated and stored in addition to the data to be stored and/or in that the data to be stored can be consecutively read under different conditions. Thus, the data originally stored in the storage device can be rapidly and easily reconstructed.

4 Claims, 2 Drawing Sheets

|      | S1 | S2 | S3 | • | • | • | Sm | Sz |
|------|----|----|----|----|----|----|----|----|
| Z1   |    |    |    |    |    |    |    |    |
| Z2   |    |    |    |    |    |    |    |    |
| Z3   |    |    |    |    |    |    |    |    |
| •    |    |    |    |    |    |    |    |    |
| •    |    |    |    |    |    |    |    |    |
| •    |    |    |    |    |    |    |    |    |
| Zn   |    |    |    |    |    |    |    |    |
| Zz   |    |    |    |    |    |    |    |    |

FIG 2

METHOD FOR OPERATING MEMORY DEVICES FOR STORING DATA

CROSS-REFERENCE TO RELATED APPLICATION

This application is a continuation of copending International Application No. PCT/EP99/02761, filed Apr. 19, 1999, which designated the United States which claimed the priority of prior provisional U.S. application Ser. No. 60/106,370, filed Oct. 30, 1998.

BACKGROUND OF THE INVENTION

Field of the Invention

The present invention relates to methods for operating memory devices for storing data a plurality of times and for reconstructing the data from the stored data.

By way of example, the memory devices are semiconductor memories such as RAMs, ROMs, EPROMs, EEPROMs, flash memories etc., or, alternatively, magnetic memories, optical memories or other memory devices. Memory devices of this kind are known and require no further explanation.

In all memory devices, there is a greater or lesser frequency of the data stored therein not corresponding to the originally stored data. Possible reasons for this are that some of the memory elements storing the data are faulty, and that even memory elements that are intact may independently change their content in the course of time. This is understandably a drawback that is extremely desirable to overcome.

To date, such storage errors or memory content changes are countered by not writing to the memory device the data which are actually to be stored themselves, but instead first converting the data which are to be stored and writing the resultant (converted) data to the memory device, the nature of the converted data being such that they can be used to reconstruct the original data even if they contain errors. Such handling of storage errors or memory content changes is perceivably associated with a very high level of effort.

SUMMARY OF THE INVENTION

It is accordingly an object of the invention to provide a method for operating the memory devices for storing data which overcomes the above-mentioned disadvantages of the prior art methods of this general type. The present invention is therefore based on the object of finding opportunities for quickly and easily dealing with any storage errors and memory content changes which there may be or which may yet arise.

With the foregoing and other objects in view there is provided, in accordance with the invention, an operating method. The method includes the steps of providing a memory device for storing data, storing the data in the memory device a plurality of times resulting in originally stored data, and reconstructing the originally stored data as required from the data stored a plurality of times taking into account a direction of any memory content changes which arise.

Accordingly, data which are to be stored in the memory device are stored in the memory device a plurality of times, and the originally stored data are reconstructed as required from the data stored a plurality of times. Additional information which is dependent on the data to be stored in the memory device is generated and is stored in addition to the data which are to be stored, and the originally stored data are reconstructed as required from the stored data and the stored additional information. The data stored in the memory device are read successively under different conditions, and the originally stored data are reconstructed as required from the data obtained during the various reading operations. The memory device is configured to store data which are to be stored in the memory device automatically in the memory device a plurality of times. The memory device is configured to generate additional information which is dependent on the data to be stored therein, and to store it in addition to the data which are to be stored. The memory device is configured to allow the data stored in the memory device to be read successively under different conditions.

Thus, the data which are originally to be stored in the memory device can be reconstructed without any complicated conversions, that is to say quickly and easily.

Any storage errors and memory content changes which there may be or which may yet arise can thus be handled extremely easily and with a minimum of effort.

In accordance with an added mode of the invention, during the reconstruction of the data originally stored in the memory device, there is the step of subjecting mutually corresponding bits of the data stored a plurality of times to a Boolean operation.

In accordance with another mode of the invention, there is the step of configuring the memory device to store the data, that are to be stored in the memory device, automatically in the memory device a plurality of times.

Other features which are considered as characteristic for the invention are set forth in the appended claims.

Although the invention is illustrated and described herein as embodied in a method for operating the memory devices for storing data, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a schematic illustration to explain a second option for handling memory contents which may contain errors or which may have changed.

DESCRIPTION OF THE DRAWINGS

Figure 1:
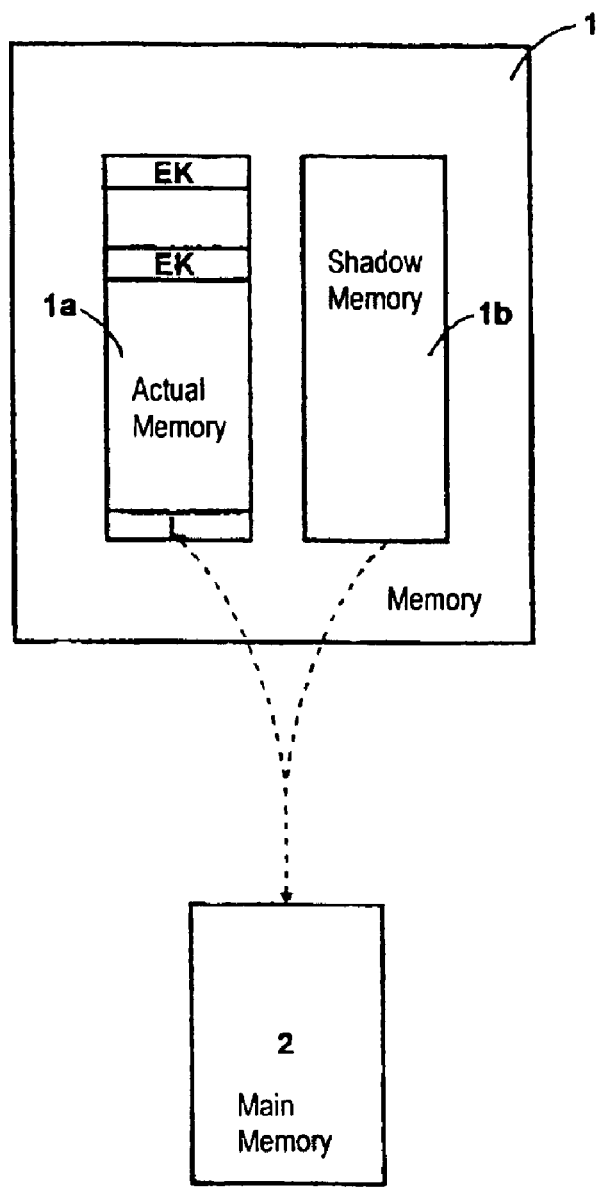
FIG. 1 is a block diagram used to explain a first option for handling memory contents which may contain errors or which may have changed according to the invention.

In all the figures of the drawing, sub-features and integral parts that correspond to one another bear the same reference symbol in each case. Referring now to the figures of the drawing in detail and first, particularly, to FIG. 1 thereof, there is shown a flash memory device 1. Before continuing, however, it should be pointed out that the memory device 1 may, in principle, also be another semiconductor memory, such as a RAM, a ROM, an EPROM, an EEPROM, or, alternatively, a magnetic memory, an optical memory or another memory.

In the example under consideration, the flash memory is a component part of a microcontroller. There is no restriction to this either. The memory device under consideration may also be a component part of any other apparatuses or may be an independent memory device.

Flash memories and other memory devices are known to have the drawback that data written thereto are from time to time incorrect because individual memory elements are faulty and/or because even data stored in memory elements which are intact change their content independently over time.

The text below presents a few options, which are very easy to implement in practice, for quickly, easily and nonetheless reliably handling memory contents that may contain errors and/or which may have changed.

It should be noted beforehand that the type of handling of memory contents which may contain errors and/or which may have changed depends on the particular situation. Particularly when data stored in the memory device are read because they are currently required by another system component, it is necessary to ensure "only" that the data which are output are the data originally written to the memory device, that is to say are free of error and are unchanged. To this end, as described more precisely at a later point, it is not necessary to detect errors and changes in data and/or to correct them in the memory device. This can be done at a later point in time, or may possibly not be done at all. On the other hand, as will likewise be described more precisely at a later point, provision may be made to correct (refresh) the memory content when no error or no change in the data has occurred at all, but rather is not to be expected for a short time.

The data stored in the memory device can be checked and/or corrected at arbitrary points in time and/or in response to arbitrary events. If checking and/or correction is carried out on a time-controlled basis, provision may be made for checking and/or correction to be carried out at particular points in time and/or no later than when a predetermined time has elapsed since the last check and/or correction. If the checking and/or correction is carried out on an event-controlled basis, provision may be made, for example, for the checking and/or correction to be carried out when the memory device or the apparatus containing it is started up and/or turned off and/or when it changes operating mode (for example when changing from the "normal" operating mode to the "sleep mode" and/or vice versa).

The first of the aforementioned options for handling memory contents which may contain errors or which may have changed consists in the data which are to be stored in the memory device being stored therein a plurality of times, and in the originally stored data being reconstructed as required from the data stored a plurality of times.

By way of example, one provision may be that the data which are to be stored are stored in the memory device three times in total. By way of example, a data item to be stored at an address x is then stored not only at the address x, but instead, automatically, additionally at the address x+m and at the address x+2m.

If the stored data are to be output from the memory device or checked for freedom from error and absence of changes, and possibly corrected, the data originally stored in the memory device are reconstructed from the data stored a plurality of times. In this case, the mutually corresponding data (in the example under consideration, the data stored at the addresses x, x+m and x+2m) are read and are evaluated bit by bit. If more than half of the mutually corresponding bits have the level 0 (the level 1), then the decision made is that the level of the relevant bit needs to be 0 (1); if fewer than half of the mutually corresponding bits have the level 0 (the level 1), then the decision made is that the value of the relevant bit is 1 (0).

The data to be stored in the memory device may naturally also be written to the memory device any number of times more than three.

If the memory content changes only in one particular direction, that is to say that only changes in the memory content from 0 to 1 or vice versa occur, it is sufficient if the data which are to be stored are stored twice in the memory device. By way of example, a data item to be stored at an address x is then stored not only at the address x, but rather, automatically, additionally at the address x+m.

If the stored data are to be output from the memory device or checked for freedom from error and absence of changes, and possibly corrected, the data originally stored in the memory device are reconstructed from the data stored in duplicate. In this case, the mutually corresponding data (in the example under consideration, the data stored at the addresses x and x+m) are read and are evaluated bit by bit. If the mutually corresponding bits have the same level, then the decision made is that the level of the relevant bit is the common level. If the mutually corresponding bits have different levels, then the decision made is that the level of the relevant bit is 0 (if memory content changes occur from the level 0 to the level 1 only, or with a very high degree of probability) or that the level of the relevant bit is 1 (if memory content changes occur from the level 1 to the level 0 only, or with a very high degree of probability).

If the data have been stored in the memory device three or more times, a counter is preferably provided for reconstructing the data originally written to the memory device, the counter counting how often 0 or 1 occurs in the mutually corresponding bits of the data stored a plurality of times. Depending on the count of the counter, a decision is then made as to whether the relevant bit has the value 0 or 1.

A counter for reconstructing the data originally written to the memory device may also be provided when the data have been stored in the memory device "only" twice. However, in this case, it is more beneficial to carry out the reconstruction using a simple Boolean operation, such as an AND operation. If the mutually corresponding bits of the data stored a plurality of times are subjected to an AND operation, then—if memory content changes occur from 0 to 1 only, or only with a very high degree of probability—the result of the AND operation represents the original value of the relevant bit. If the memory content changes occur from 1 to 0 only, or only with a very high degree of probability, the input and output signals of the AND operation need to be inverted, or an OR operation needs to be carried out.

The data originally written to the memory device can be reconstructed using Boolean operations even in cases in which the data that are to be written to the memory device are written thereto more than twice.

The data reconstructed in the manner described or in a similar manner represent the data originally stored in the memory device with a degree of probability bordering on certainty. They can be output from the memory device for the intended use of the stored data or can be used to establish whether and, if appropriate, which of the data stored in the memory device are incorrect (have changed).

To establish whether and, if appropriate, which of the data stored in the memory device are incorrect (have changed), the reconstructed data are compared with the data stored in the memory device. Differences between the reconstructed data and the data stored in the memory device arise for memory elements which are faulty or whose content has changed. These memory elements can be overwritten with the correct (reconstructed) data immediately or at a later point; therefore faulty memory elements can be detected and memory content changes can be reversed.

Particularly in memory devices which, like the flash memories considered in more detail in the present case, for example, can be overwritten only in relatively large units (sectors), it is found to be advantageous if all the errors present within at least one sector are first ascertained and are then corrected in a single overwriting operation.

The data originally stored in the memory device can be reconstructed, and data that are incorrect or have changed within the memory device can be ascertained and corrected, using hardware or software.

Implementation in software is found to be advantageous because it can also be used in conventional memory devices (in those not configured specifically for the measures described).

One option for implementation in software is described below with reference to FIG. 1.

The memory device for which this is done is denoted by the reference symbol 1 in FIG. 1. It is the program memory 1 of a microcontroller.

The memory device 1 is produced such that—if at all—only memory content changes in which the level 0 becomes the level 1 occur. In this case, it is sufficient if data which are to be stored in the memory device are stored therein twice.

Accordingly, the memory device 1 is subdivided into two areas, namely the actual program memory 1a and a "shadow memory" 1b. Data that are to be written to the memory device 1 are written both to the program memory 1a and to the shadow memory 1b. The shadow memory 1b is—if and so long as there are no storage errors and memory content changes—an exact copy of the program memory 1a.

The program memory 1a stores executable programs (programs that can be executed by a CPU of the microcontroller) and any data required for the program execution. In the example under consideration, the program or programs for reconstructing the data written to the memory device and also for ascertaining and correcting memory contents which are incorrect or have changed are also stored in the program memory 1a. Before continuing, however, it should be pointed out that these programs may also be stored in other memory devices (preferably in a ROM contained in the microcontroller).

Programs to be executed are loaded from the program memory 1a into a main memory 2 and are executed from there.

In the example under consideration, when the microcontroller has been started up, a program for ascertaining and correcting data errors and memory content changes is executed. This program is denoted by the reference symbol EK in FIG. 1. When the microcontroller has been started up, this stored program is transferred from the program memory 1a to the main memory 2 by a stored (likewise stored in the program memory 1a) loading program L and is executed from the main memory.

When loading the ascertainment and correction program EK, the loading program L reconstructs the data which represent this program. So that this can be done with as little effort as possible, the ascertainment and correction program EK is stored in the program memory 1a twice, preferably within the same sector of the program memory 1a.

When the ascertainment and correction program EK is loaded into the main memory 2, mutually corresponding bits of the versions of the ascertainment and correction program EK which are stored in the program memory 1a are subjected to an AND operation, and the result of the AND operation is written to the main memory 2. The effect achieved by this, as already explained above, is that the ascertainment and correction program EK appears in the main memory 2 in its version originally written to the memory device 1, that is to say without errors.

The ascertainment and correction program EK reads the program memory 1a and the shadow memory 1b and compares the resultant data with the data which were originally written to the memory device 1 and can be reconstructed as described above, and/or compares the mutually corresponding data with one another. This ascertains which data within the memory device 1 do not correspond to the data originally written thereto. The data for which this is the case are corrected by overwriting them with the correct (reconstructed) data. The correction is made, in particular, when, as in the case of the flash memory under consideration in the present case, a memory is involved which can be overwritten only in relatively large units (segment by segment), not immediately, but rather only after one, a plurality or all of the segments have been checked. For the data ascertained as being incorrect, the address and the correct value are then buffer-stored in the main memory 2.

When the ascertainment and correction program EK has been executed, it can be assumed that all the data stored in the memory device 1, i.e. both those in the program memory 1a and those in the shadow memory 1b, are free of error (correspond to the data originally written to the memory device).

Errors are prevented with a degree of probability bordering on certainty. The reconstruction of the ascertainment and correction program EK before it is used also prevents errors which exist in the memory device 1 on account of errors in the ascertainment and correction program EK from remaining undetected, or errors from being generated by the ascertainment and correction program EK. Only the loading program L needs to be free of error and to work correctly even without prior reconstruction and checking, since it cannot be checked and corrected before it is executed. This is not all that much of a problem, however, because the loading program L can be very short (for example only approximately 40 bytes long), and hence the probability of errors is negligibly low. Incidentally, minimization of the probability of errors occurring within the loading program L is the reason why the ascertainment and correction program EK is stored twice within the program memory 1a (that is to say a total of four times in the memory device 1). This provides the ascertainment and correction program EK in duplicate within the program memory 1a (within one segment thereof) and makes it possible to reconstruct the ascertainment and correction program EK using shorter and/or more manageable addresses than would be the case if it were necessary to access the program memory 1a and the shadow memory 1b alternately, or various segments within the program memory 1a. In addition or as an alternative, the probability of errors in the loading program L can also be reduced by virtue of the loading program L being written and/or coded such that it primarily contains ones (for the case in which memory content changes occur from 0 to 1 only, or with the utmost degree of probability only) or zeros (for the case in which memory content changes occur from 1 to 0 only, or with the utmost degree of probability only).

Another option for reconstructing the data originally written to the memory device and for ascertaining and correcting data which are incorrect or have changed in the memory device consists in generating additional information which is dependent on the data to be stored in the memory device, and storing it in addition to the data which are to be stored.

The additional information can, by way of example, be formed from parity bits that are formed for a particular memory area.

Figure 2:
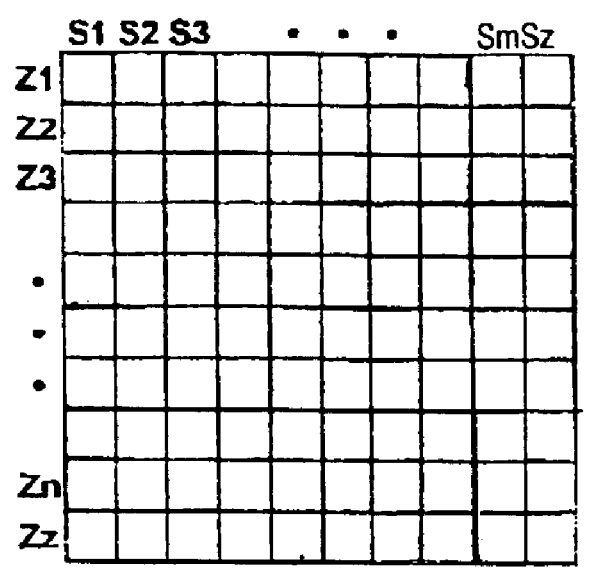

This is illustrated schematically in FIG. 2.

FIG. 2 shows the memory device 1 having n+1 (memory element) rows and m+1 (memory element) columns. Of the n+1 rows (rows Z1 to Zn and Zz), n rows, more precisely the rows Z1 to Zn, are provided for storing data which are to be stored in the memory device; the last row Zz is reserved for storing the aforementioned additional information. A similar case applies to the columns. Of the m+1 columns (columns S1 to Sm and Sz), m columns, more precisely the columns S1 to Sm, are provided for storing data which are to be stored in the memory device; the last column Sz is reserved for storing the aforementioned additional information.

In the example under consideration, the additional information contains parity bits. Before continuing, however, it should be pointed out that the additional information may also represent any information other than the parity of the data which are actually to be stored in the memory device.

The parity bits stored in the additional row Zz are each formed taking into account the data stored in the relevant column of the rows Z1 to Zn. Therefore, the parity bit stored in row Zz, column Sa depends on the data stored in the column Sa of the rows Z1 to Zn.

The same applies to the parity bits stored in the additional column Sz: these are each formed taking into account the data stored in the relevant row of the columns S1 to Sm. Therefore the parity bit stored in row Zb, column Sz depends on the data stored in the row Zb of the columns S1 to Sm.

The parity bit stored in row Zz, column Sz represents the parity of the parity bits stored in the columns S1 to Sm of the row Zz and of the parity bits stored in the rows Z1 to Zn of the column Sz.

If the data stored in the rows Z1 to Zn and in the columns S1 to Sm change, the associated parity bits need to be updated.

The parity bits stored in the additional row Zz and the parity bits stored in the additional column Sz can then be used at any time to ascertain whether the data stored in the rows Z1 to Zn and the data stored in the columns S1 to Sm are free of error. Any error that exists can be quickly and easily located and corrected. The stored parity bits and the parity bits ascertained from the current content of the rows Z1 to Zn and from the columns S1 to Sm can be used to establish quickly whether and, if appropriate, where (in which row and in which column) incorrect data exist. It is possible to establish whether the stored parity bits are free of error by use of the parity bit stored in row Zz, column Sz.

The effect which can be achieved by detecting and correcting incorrect data in the manner described is that only error-free (reconstructed) data are output from the memory device and/or are stored therein.

The method described allows one error to be detected and corrected per row and per column. This may appear to be inadequate, particularly for memory devices having a large storage capacity (having a large number of rows and/or columns). However, it is possible to stipulate freely how many rows and/or how may columns are used as a basis for the parity formation; n and m can be freely selected independently of one another, which results in that a memory device can be subdivided into an arbitrary number of memory areas of the type shown in FIG. 2. The smaller n and/or m are, the greater is the probability that all the errors existing in the memory device can be detected and corrected. The probability of all the errors existing in the memory device being able to be detected and corrected can be increased, in addition or as an alternative, by providing per n rows and m columns a plurality (x) of additional rows and/or additional columns in which not just the least significant bit of the checksum, but rather the last x least significant bits thereof are stored. More than one error can then also be detected and corrected per row and column of the memory area that can be used for data storage.

The check bits provided per row and per column do not have to relate to all the elements in the relevant row or column. Provision may also be made for the check bits to be formed by exclusively taking into account specifically selected memory elements within the relevant row or column. These specifically selected memory elements are preferably those memory elements which are apt to fail or to change their content most readily within the relevant row or column. Memory elements which never or most likely never fail or change their content, or at least do not do so before other memory elements, can be left out of the check bit formation. The memory elements that do need to be taken into account can be selected using a mask, for example.

Another option for handling memory content changes consists in reading data stored (only once and without check bits) in the memory device successively under different conditions, and in reconstructing the originally stored data from the data obtained during the various reading operations.

In the example under consideration, the different reading conditions are various threshold values which are used during reading of the memory elements to decide whether the value stored in the relevant memory element is 0 or 1.

In semiconductor memories, the content of a memory element is frequently determined on the basis of the potential of the "bit line". The definition of the bit line in semiconductor memories is known generally and requires no further explanation. If the bit line potential is on the near side of the threshold value used, then the decision made is that the content of the relevant memory element is 0. If the bit line potential is on the far side of the threshold value used, then the decision made is that the content of the relevant memory element is 1.

Normally, the threshold value is approximately in the center between the bit line's potential which it adopts for a content 0 of the relevant memory element and the bit line's potential which it adopts for a content 1 of the relevant memory element. The threshold value is used for one of the two reading operations.

In the other reading operation, a threshold value that has been shifted from the center is used. The threshold value has preferably been shifted toward the potential that the bit line adopts in the case of changeable memory element contents. For the example under consideration, in which the memory device is configured such that any memory content changes which occur change the memory content 0 to the memory content 1 only (and not vice versa), this results in that the threshold value is more or less close to the potential of the bit line which it is apt to adopt for a memory element content 0.

If, during successive reading operations with the various threshold values, data are obtained which are the same, results in that no memory content change is imminent. If, on the other hand, data which are different are obtained during successive reading operations with the various threshold values, then this indicates that a memory content change is soon to be expected when the normal threshold value is used. The different data which are obtained when different threshold values are used signal that the memory content is about to change.

If a memory content change is found to be imminent, the relevant memory element is preferably immediately overwritten with the data originally written to the memory device. In the case under consideration, the data originally written to the memory device are those data that are obtained when the originally written data are read using the normal threshold value.

If this type of ascertainment and correction of (imminent) data errors is regularly repeated at short intervals, then, during normal operation of the memory device, the data do not need to be checked for errors with each read operation. They can be read using the normal threshold value and can be output and used without checking.

Of course, another provision may be for the reading operations carried out in succession to be executed using differently stipulated threshold values. The threshold values also need not refer to a voltage or a potential, but instead may also define other physical quantities, such as a current flowing via the bit line or a current produced by the bit line potential in the sense amplifier or elsewhere.

Particularly in the case of the last option described, but also in the case of the other options described for handling data which are incorrect or have changed, it is found to be advantageous if the memory device can be overwritten in small subunits, for example in units of rows or columns. In this case, it is also possible to reprogram individual rows or columns within a memory device sector which can usually be reprogrammed only as one cohesive unit. Any influences, arising in the course of such reprogramming, on the component parts of the relevant sector which have not been reprogrammed can be tolerated in this case, because they can be detected and eliminated as required by means of checking and correction carried out as described, of course. For a procedure of this kind, the memory space required for buffer-storing the data which are to be written to the memory device can be kept small. In the case of row-by-row or column-by-column reprogramming, a small buffer memory having a storage capacity (for example 128 bytes) which corresponds to the storage capacity of the row or column which is to be reprogrammed is sufficient, and which is a great advantage, particularly when the memory device in question is a component part of a microcontroller, as in the example under consideration.

The various options for reconstructing the data originally written to the memory device and for ascertaining and/or correcting memory contents that are incorrect or have changed can be combined with one another as desired. In this context, it is found to be particularly advantageous if the first two options described also make use of the variability of the threshold value when reading data from the memory device. If a threshold value which is shifted as compared with the normal threshold value is used at least from time to time when ascertaining and correcting memory contents which are incorrect or have changed, memory content changes can be detected earlier (at the actual starting stage) and/or more reliably.

The options described for dealing with any storage errors and memory content changes that there may be or which may yet occur can be provided and implemented quickly and easily independently of the details of the practical implementation.

We claim:

1. An operating method, which comprises the steps of:

providing a memory device for storing data bits that may change their level from 0 to 1 or from 1 to 0, it being more likely that the stored data bits will change their level from 0 to 1 than from 1 to 0, or vice versa;

storing the data bits in the memory device a plurality of times resulting in originally stored data;

providing additional information about whether it is more likely that the stored data bits will change their level from 0 to 1 or from 1 to 0; and reconstructing the originally stored data as required from the data stored a plurality of times, taking into account the additional information.

2. The method according to claim 1, which comprises during the reconstruction of the data originally stored in the memory device, subjecting mutually corresponding bits of the data stored a plurality of times to a Boolean operation.

3. The method according to claim 1, which comprises configuring the memory device to store the data, that are to be stored in the memory device, automatically in the memory device a plurality of times.

4. The method according to claim 1, which comprises:

providing additional information dependent on the data being stored in the memory device; and reconstructing the originally stored data as required from the data stored a plurality of times and the additional information.

* * * * *